United States Patent
Lu et al.

(10) Patent No.: US 12,347,927 B2
(45) Date of Patent: Jul. 1, 2025

(54) LOW COST, LOW LOSS MATERIAL FOR MICROWAVE OR ANTENNA PRINTED CIRCUIT BOARD

(71) Applicant: HUGHES NETWORK SYSTEMS, LLC, Germantown, MD (US)

(72) Inventors: Bingqian Lu, Olney, MD (US); Peter Hou, Gaithersburg, MD (US); Taiwei Yue, Germantown, MD (US); Brian Clough, Germantown, MD (US); Harry Johnson, Germantown, MD (US); John Corrigan, Germantown, MD (US)

(73) Assignee: HUGHES NETWORK SYSTEMS, LLC

( * ) Notice: Subject to any disclaimer, the term of this patent is extended or adjusted under 35 U.S.C. 154(b) by 508 days.

(21) Appl. No.: 16/685,986

(22) Filed: Nov. 15, 2019

(65) Prior Publication Data
US 2021/0151869 A1    May 20, 2021

(51) Int. Cl.
| | |
|---|---|
| *H01Q 1/38* | (2006.01) |
| *H01Q 1/48* | (2006.01) |
| *H01Q 9/04* | (2006.01) |
| *H05K 1/02* | (2006.01) |
| *H05K 1/03* | (2006.01) |

(Continued)

(52) U.S. Cl.
CPC ............ *H01Q 1/38* (2013.01); *H01Q 1/48* (2013.01); *H01Q 9/0407* (2013.01); *H05K 1/0237* (2013.01); *H05K 1/0346* (2013.01); *H05K 1/115* (2013.01); *H05K 3/4069* (2013.01);

(Continued)

(58) Field of Classification Search
CPC ...... H01Q 1/38; H01Q 9/0414; H01Q 9/0407; H01Q 3/44; H01Q 15/08; H01Q 15/12; H01Q 15/22; H01Q 15/14; H01Q 15/141–144; H01Q 15/244; H01Q 9/0457; H05K 2201/0145
See application file for complete search history.

(56) References Cited

U.S. PATENT DOCUMENTS

| | | | |
|---|---|---|---|
| 4,937,585 A | 6/1990 | Shoemaker | |
| 2008/0007460 A1 | 1/2008 | Ke et al. | |

(Continued)

FOREIGN PATENT DOCUMENTS

| | | | | |
|---|---|---|---|---|
| CN | 110112552 A | | 8/2019 | |
| JP | H07-183722 A | | 7/1995 | |
| JP | 2019103037 A | * | 6/2019 | ............. H01Q 13/08 |

OTHER PUBLICATIONS

European Extended Search Report issued in Application No. 20207777.2, dated Apr. 7, 2021.

*Primary Examiner* — Graham P Smith
(74) *Attorney, Agent, or Firm* — Potomac Technology Law, LLC

(57) ABSTRACT

An apparatus and method for producing a low loss printed circuit board (PCB). The PCB includes an antenna patch, a ground plane, and a polarizer. The antenna patch consists of a plastic base having a first plurality of circuit patterns formed directly on its top surface. The ground plane is formed directly on a bottom surface of the plastic base used for the antenna patch, and contains one or more coupling circuit patterns. A polarizer spacer is provided on the antenna patch to provide separation from the polarizer. The polarizer also consists of a second plastic base having a second plurality of circuit patterns formed directly thereon.

20 Claims, 8 Drawing Sheets

(51) Int. Cl.
*H05K 1/11* (2006.01)
*H05K 3/40* (2006.01)
(52) U.S. Cl.
CPC ............... *H05K 2201/0145* (2013.01); *H05K 2201/093* (2013.01); *H05K 2203/085* (2013.01)

(56) References Cited

U.S. PATENT DOCUMENTS

| | | | |
|---|---|---|---|
| 2008/0238793 A1* | 10/2008 | Channabasappa | H01Q 9/0457 343/767 |
| 2015/0197063 A1* | 7/2015 | Shinar | G06F 30/39 700/98 |
| 2020/0313303 A1* | 10/2020 | Milroy | H01Q 21/0006 |
| 2020/0381842 A1* | 12/2020 | Milroy | H01Q 15/144 |

\* cited by examiner

LOW COST, LOW LOSS MATERIAL FOR MICROWAVE OR ANTENNA PRINTED CIRCUIT BOARD

BACKGROUND INFORMATION

Printed circuit boards (PCBs) are widely used in modern electronic devices such as televisions, mobile phones, computers, cars, etc. Such extensive applications have reduced the cost of producing PCBs that are used in, for example, consumer electronics. PCBs used for specialized applications such as high frequency antenna boards and microwave materials, however, are much less common. Consequently, the manufacturing costs associated such PCBs have remained relatively high. Such specialized applications are often subject to tightly controlled requirements pertaining to dielectric constant, dielectric loss tangent, and heat expansion, thereby further increasing material and manufacturing costs. The dielectric constant and loss tangent, for example, are two important parameters in microwave and antenna design because they affect the geometry size or trace width as well as the gain. In contrast to consumer and widely available electronic devices, the market for PCBs used microwave and antenna design has remained very low.

Recent developments in satellite technology have increased the availability of satellite services to consumers. For example, consumers residing in areas that are not serviced by traditional service providers are able to use satellite systems for voice and data (e.g., music, television, video) services. These services can be accessed, in part, using a satellite terminal that includes an outdoor antenna. The increased availability of satellite services has also created an increased demand for specialized PCBs that can be used to produce antennas for satellite communication systems.

Existing microwave antennas, however, are generally designed commercial and/or military operations. These microwave antennas, therefore, incorporate PCBs designed to withstand significant levels of heat, shock, and vibration. Furthermore, the number of suppliers/manufacturers for specialized PCBs used in such microwave antennas is limited relative to manufacturers of consumer-based PCBs. As such, the manufacturing costs for specialized PCBs can be very high.

Antennas used in consumer satellite terminals are not subject to high levels of shock and/or vibration and, therefore, do not require the high standards of existing microwave PCBs. Consumer satellite terminals are typically mounted on a fixed structure, such as a home, and remain stationary. In contrast to existing microwave antennas, such terminal antennas require an ability to form a steerable beam that can be automatically pointed to the satellite, and periodically repointed the antenna beam to compensate for minor antenna movements due to ground settlement, ground freezing/thawing cycles, etc. Furthermore, when consumer satellite antennas used on moving platforms, such as cars, trains, boats, or airplanes, they require a cost-effective way of fast beam tracking that constantly points the antenna beam toward the satellite.

Based on the foregoing, there is a need for an approach for providing a specialized PCB that can be used in antennas for satellite, microwave, and other applications without the costs associated with existing microwave antennas.

BRIEF SUMMARY

An apparatus and method are disclosed for producing a microwave or antenna PCB using a low cost, low loss material. According to an embodiment, the apparatus includes: an antenna patch including: a first plastic base, and a first plurality of circuit patterns formed directly on a top surface of the first plastic base; a ground plane containing one or more coupling circuit patterns formed directly on a bottom surface of the first plastic base, a polarizer spacer disposed on the antenna patch; and a polarizer including: a second plastic base disposed on the polarizer spacer, and a second plurality of circuit patterns formed directly on the second plastic base.

According to another embodiment, the method includes: forming an antenna patch by: selecting a first plastic base, and forming a first plurality of circuit patterns directly on a top surface of the first plastic base; and forming a ground plane containing one or more coupling circuit patterns directly on a bottom surface of the first plastic base.

According to another embodiment, the method includes: forming an antenna patch by: selecting a first plastic base, and forming a first plurality of circuit patterns directly on a top surface of the first plastic base; forming a ground plane containing one or more coupling circuit patterns directly on a bottom surface of the first plastic base, disposing a polarizer spacer on the antenna patch; and forming a polarizer on the polarizer spacer by: disposing a second plastic base on the polarizer spacer, and forming a second plurality of circuit patterns directly on the second plastic base The foregoing summary is only intended to provide a brief introduction to selected features that are described in greater detail below in the detailed description. As such, this summary is not intended to identify, represent, or highlight features believed to be key or essential to the claimed subject matter. Furthermore, this summary is not intended to be used as an aid in determining the scope of the claimed subject matter.

BRIEF DESCRIPTION OF THE DRAWINGS

Various exemplary embodiments are illustrated by way of example, and not by way of limitation, in the figures of the accompanying drawings in which like reference numerals refer to similar elements and in which.

DETAILED DESCRIPTION

An apparatus and method for producing a microwave or antenna PCB using a low cost, low loss material are described. In the following description, for purposes of explanation, numerous specific details are set forth in order to provide a thorough understanding of the disclosed embodiments. It will become apparent, however, to one skilled in the art that various embodiments may be practiced without these specific details or with an equivalent arrangement. In other instances, well-known structures and devices are shown in block diagram form in order to avoid unnecessarily obscuring the various embodiments.

Figure 1:
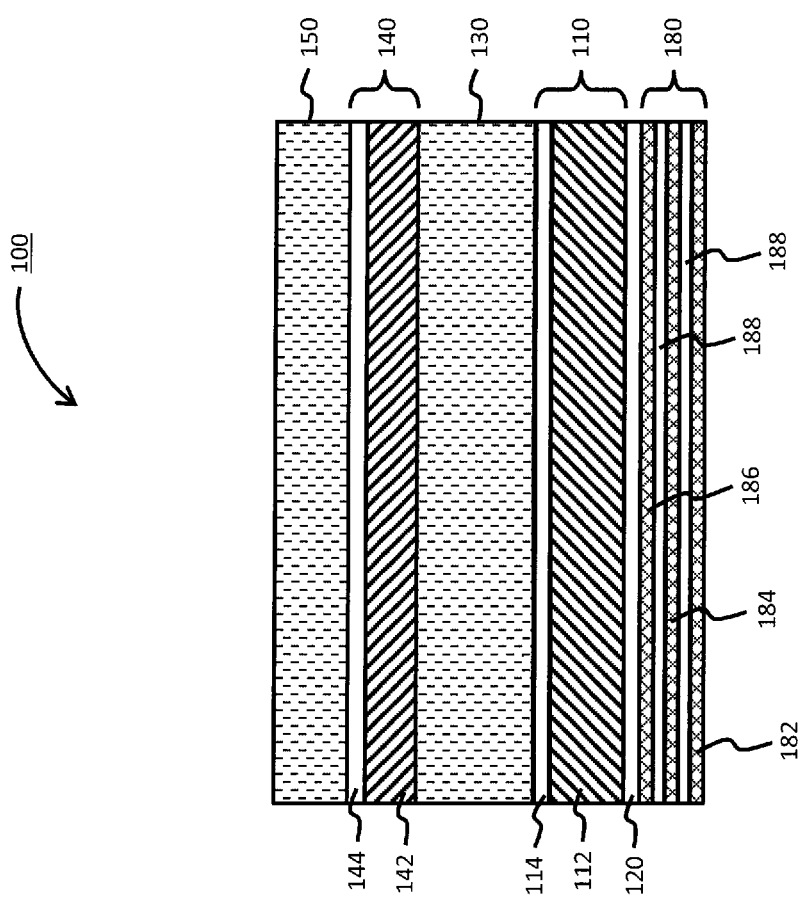
FIG. 1 is a diagram of a PCB incorporating a low loss, low cost material, according to one embodiment.

FIG. 1 illustrates a PCB 100 in accordance with at least one embodiment. The PCB 100 includes an antenna patch 110, a ground plane 120, a polarizer spacer 130, a polarizer 140, and a foam cap 150. The ground plane 120 includes one or more coupling circuit patterns, for example, a PCB circuit assembly 180 configured for coupling the PCB 100 with external components. According to various configurations, the PCB circuit assembly 180 can include multiple layers containing control circuitry, DC power distribution, RF power distribution, etc. According to the illustrated embodiment, the PCB circuit assembly includes a first PCB layer 182, a second PCB layer 184, and a third PCB layer 186. An insulating layer 188 is provided between PCB layer 182 and PCB layer 184, and between PCB layer 184 and 186. The insulating layers 188 can configure, for example, as dielectric layers. It should be noted, however, that the number of PCB layers can be increased or decreased depending on the specific design requirements.

As illustrated in FIG. 1, the antenna patch 110 includes a plastic base 112 and circuit patterns 114. According to one implementation, the plastic base 112 can have a thickness ranging from 0.3 mm-0.5 mm. It should be noted, however, that the thickness of the plastic base 112 can be above or below this exemplary range depending on the specific implementation and packaging size constraints. The plastic base 112 can be constructed from various materials including, but not limited to, PET, polystyrene, polypropylene, copolymers, etc. Depending on the specific structural requirements, the plastic material can be infused (or manufactured) with additives such as glass beads, fibers, or both in order to increase stiffness. According to the illustrated embodiment, the circuit patterns 114 of the antenna patch 110 are formed directly on a top surface of the plastic base 112. Furthermore, the ground plane 120 and coupling circuit patterns are formed directly on a bottom surface of the plastic base 112.

According to at least one embodiment, the ground plane 120 and the circuit patterns 114 are printed on the plastic base 112 using a conductive ink. For example, a 3D printer can be utilized to apply a metallic ink material having sufficient conductive properties to satisfy the design requirements for the PCB 100. Various types of conductive ink can be selected including, without limitation, metallic materials, carbon based materials, graphite-based materials, etc. According to other embodiments, conventional fabrication techniques can be utilized to form the circuit patterns 114 and the ground plane 120. For example, the circuit patterns 114 can be formed by depositing a metallic (or conductive) layer onto the plastic base 112, and aligning a photomask containing the circuit design for the circuit patterns 114. The circuit design can then be transferred onto the metallic/conductive layer. Next, an etching process can be performed to remove any excess portions of the metallic layer, thereby retaining the circuit patterns 114 on the plastic base 112. If multiple layers must be fabricated to achieve the circuit patterns 114, then the process can be repeated for each subsequent layer. The coupling circuit patterns which make up the ground plane 120 can also be formed using conventional techniques. Furthermore, various embodiments can incorporate multiple layers for the coupling patterns which make up the ground plane 120.

Next, a polarizer spacer 130 is aligned with, and disposed on, the circuit patterns 114 of the antenna patch 110. According to at least one implementation, the polarizer spacer 130 can be constructed of a foam material and have a thickness ranging from 0.5 mm-0.9 mm. The thickness of the polarizer spacer 130 can also be smaller or larger than this range depending on the specific design requirements. A polarizer 140 is subsequently provided on the polarizer spacer 130. According to the embodiment illustrated in FIG. 1, the polarizer 140 can include, for example, a plastic base 142 that is aligned with and disposed on the polarizer spacer 130. The plastic base 142 can have a thickness ranging from 0.09 mm-0.15 mm, depending on the specific design requirements. Furthermore, the plastic base 142 can be constructed from various materials such as, for example, PET, polystyrene, polypropylene, copolymers, etc. The polarizer 140 further includes circuit patterns 144 formed directly on the plastic base 142. Similar to the ground plane 120 and the antenna patch 110, the circuit patterns 144 of the polarizer 140 can be formed by utilizing a 3D printer capable of operating with conductive ink. According to other embodiments, however, conventional PCB fabrication techniques can be utilized to form the circuit patterns 144. The foam cap 150 is subsequently disposed on the circuit patterns 144. The PCB circuit assembly 180 is then connected electrically and/or physically to the ground plane 120.

Figure 2:
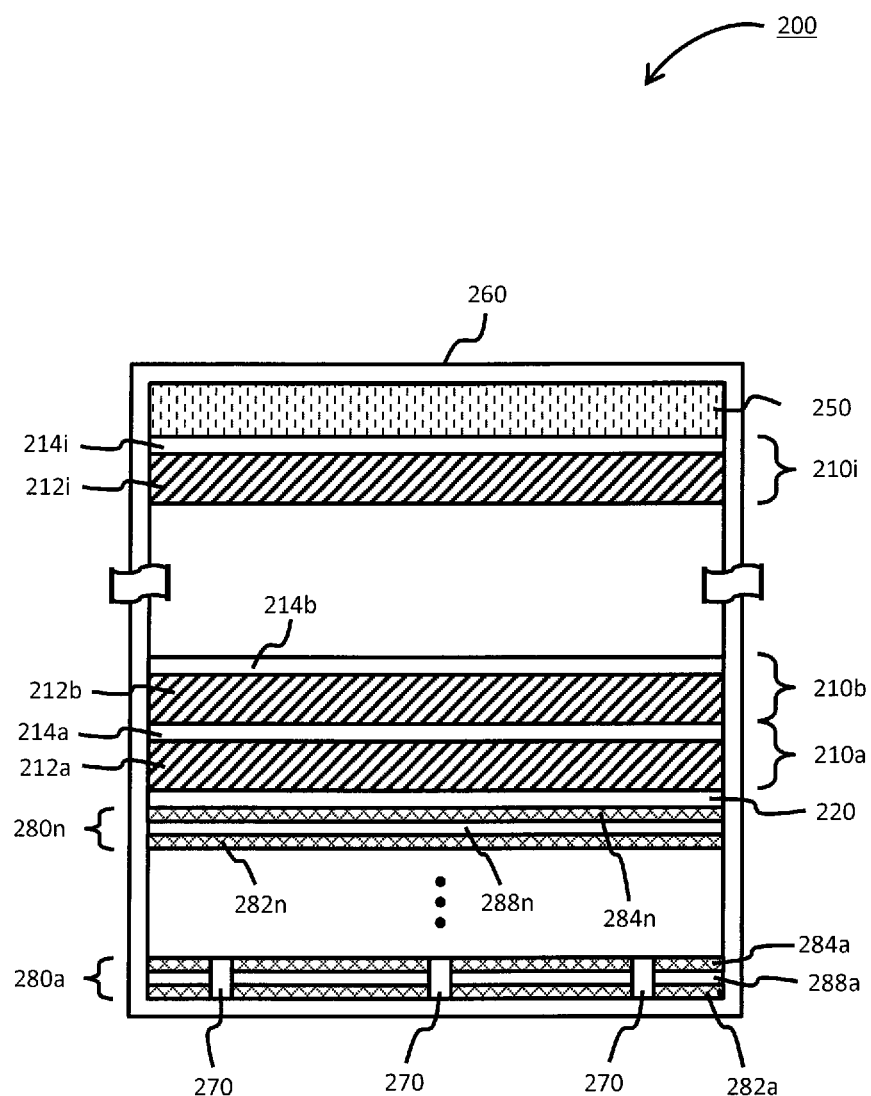
FIG. 2 is a diagram of a PCB incorporating a low loss, low cost material, according to another embodiment.

FIG. 2 illustrates a PCB 200 in accordance with various embodiments. The PCB 200 includes multiple antenna patches 210a-210i. Specifically, PCB 200 includes a first antenna patch 210a, a second antenna patch 210b, ... and an $i^{th}$ antenna patch 210i. The first antenna patch 210a contains a plastic base 212a and circuit patterns 214a formed directly on a top surface of the plastic base 212a. A ground plane 220, which is made up of (i.e., includes) one or more coupling circuit patterns 280, is formed directly on a bottom surface of the plastic base 212a. Each additional antenna patch (210b-210i) is arranged on top of one another. According to at least one implementation, the plastic base 212a can have a thickness ranging from 0.125 mm-0.5 mm. This exemplary range, however, should not be construed as limiting, as it may can be increased at the upper end (i.e., greater than 0.5 mm) or decreased (i.e., less than 0.125 mm) at the lower end, depending on the specific design requirements. The plastic base 212a can also be constructed from various materials including, PET, polystyrene, polypropylene, copolymers, etc. The first antenna patch 210a further includes circuit patterns 214a formed directly on a top surface of the plastic base 212a.

According to at least one embodiment, the circuit patterns 214a and the coupling circuit patterns which make up the ground plane 220 can be formed by a printing process which utilizes conductive ink, or using conventional fabrication processes. For example, the circuit patterns 214a and the coupling circuit patterns of the ground plane 220 can be formed by printing conductive ink directly on the plastic base 212a. A 3D printer can be utilized to apply a metallic ink material having sufficient conductive properties to satisfy the design requirements for the PCB 200. Various types of conductive ink can be selected including, without limitation, metallic materials, carbon based materials, graphite-based materials, etc. According to other embodiments, however, conventional fabrication techniques can also be utilized to form the circuit patterns 214a and ground plane 220. More particularly, the circuit patterns 214a can be formed by depositing a metallic (or conductive) layer onto the plastic base 212a, and aligning a photomask containing the circuit design for the circuit patterns 214a. The circuit design can then be transferred onto the metallic/conductive layer. Next, one or more etching processes (wet and/or dry)

can be performed to remove any excess portions of the metallic layer, thereby retaining the circuit patterns 214a on the plastic base 212a. If multiple circuit layers must be fabricated to achieve the further circuit patterns 214b-214i or the ground plane 220, then the process can be repeated for each subsequent layer.

As illustrated in FIG. 2, the second antenna patch 210b is formed (or arranged) on the first antenna patch 210a. The second antenna patch 210b can include a plastic base 212b disposed directly on the circuit patterns 214a of the first antenna patch 210a. The second antenna patch 210b also includes circuit patterns 214b formed directly on a top surface of the plastic base 212b. As illustrated in FIG. 2, the antenna patches 210 can be repeatedly stacked on each other until the $i^{th}$ (or final) antenna patch 210i is reached. According to various embodiments, some or all of the antenna patches 210a-210i can be identically configured. For example, the second antenna patch 210b through the $i^{th}$ antenna patch 210i can each include circuit patterns 214 (i.e., 214a, 214b, . . . 214i) formed by a printing process which utilizes conductive ink, or using conventional fabrication processes. The thickness of the plastic bases 212 (i.e., 212a, 212b, . . . 212i) can also be identical. According to other embodiments, however, the thickness of the plastic bases 212 may be different from each other, and some of the circuit patterns 214 can printed using conductive ink while others are formed using various fabrication processes.

The PCB 200 illustrated in FIG. 2 can also include one or more PCB circuit assemblies 280. If a single PCB circuit assembly 280 is provided, it is directly connected to the ground plane 220. If multiple PCB circuit assemblies 280a-280n are provided, however, only the final PCB circuit assembly 280n is directly connected to the ground plane. Each PCB circuit assembly 280 can further include multiple layers containing control circuitry, DC power distribution, RF power distribution, etc. According to various embodiments, each the PCB circuit assembly 280 can include a PCB layer 282 and a PCB layer 284 (i.e., 282a and 284a of PCB layer 280a, and 282n and 284n of PCB layer 280n). An insulating layer 288 is interposed between the PCB layer 282 and the PCB layer 284 (i.e., 288a between 282a and 284a of PCB layer 280a, and 288n between 282n and 284n of PCB layer 280n). According to at least one implementation, the insulating layer 288 can be constructed from a dielectric material. Additional PCB layers can also be provided depending on the specific design requirements. As illustrated in FIG. 2, vias or through holes 270 can be formed within the PCB circuit assembly 280 to interconnect different PCB layers (282, 284), interconnect the different PCB circuit assemblies 280, interconnect the different PCB circuit assemblies 280 to the antenna patches 210, ground plane 220, or any combination of the foregoing interconnections.

According to the illustrated embodiment, a foam cap 250 can be disposed on the $i^{th}$ circuit pattern 214i of the $i^{th}$ antenna patch 210i. According to an exemplary system implementation, the foam cap 250 can have a thickness ranging from 4 mm-8 mm. Depending on the particular application, the foam cap 250 may also incorporate a predetermined amount of curvature. If the PCB 200 will be subject to environmental conditions such as rain, the curvature can assist in directing water off its surface. The PCB 200 further includes a seal 260 which surrounds (or wraps around) the ground plane 220, the antenna patches 210, the PCB circuit assemblies 280, and the foam cap 250. A vacuum can subsequently be applied in order to form a monolithic component. According to an embodiment, the seal 260 can be in the form of a hydrophobic film (e.g., Teflon, SilverStone, etc.) having a thickness ranging from 0.09 mm-0.15 mm.

Figure 3:
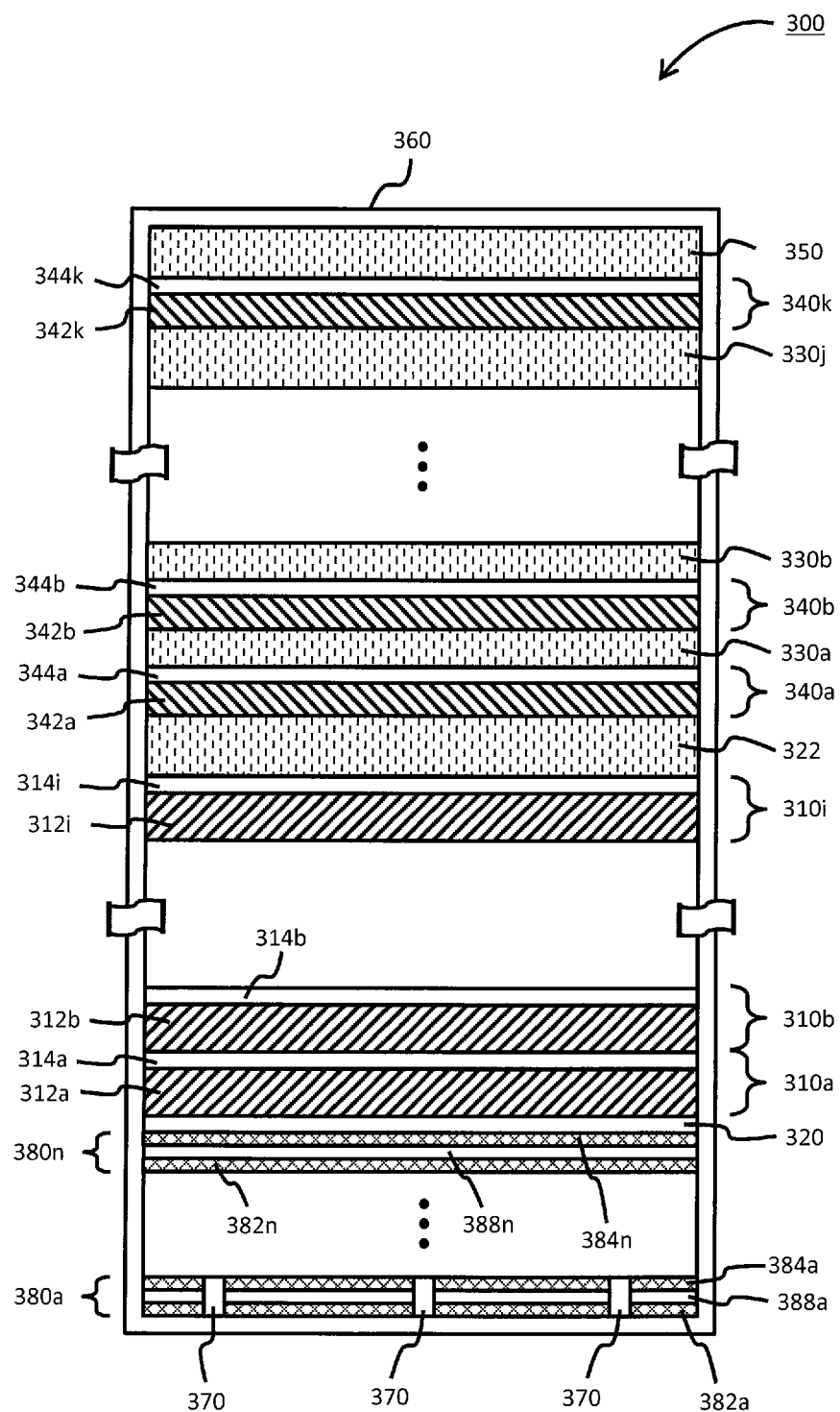
FIG. 3 is a diagram of a PCB incorporating a low loss, low cost material, according to various embodiments.

FIG. 3 illustrates a PCB 300 in accordance with various embodiments. The PCB 300 is configured as a multi-layer meanderline polarizer. The PCB 300 includes multiple antenna patches 310a-310i. Specifically, PCB 300 includes a first antenna patch 310a, a second antenna patch 310b, and an $i^{th}$ antenna patch 310i. The first antenna patch 310a contains a plastic base 312a and circuit patterns 314a formed directly on a top surface of the plastic base 312a. A ground plane 320, which is made up of (i.e., includes) one or more coupling circuit patterns 380, is formed directly on a bottom surface of the plastic base 312a. Each additional antenna patch (310b-310i) is arranged on top of one another. According to at least one implementation, the plastic base 312a can have a thickness ranging from 0.125 mm-0.5 mm. It should be noted, however, that the thickness of the plastic base 312a can be above or below this exemplary range depending on the specific implementation. The plastic base 312a can also be constructed from various materials including, PET, polystyrene, polypropylene, copolymers, etc. The first antenna patch 310a further includes circuit patterns 314a formed directly on a top surface of the plastic base 312a.

According to at least one embodiment, the circuit patterns 314a and the coupling circuit patterns which make up the ground plane 320 can be formed by a printing process which utilizes conductive ink, or using conventional fabrication processes. For example, the circuit patterns 314a and the coupling circuit patterns of the ground plane 320 can be formed by printing conductive ink directly on the plastic base 312a. A 3D printer can be utilized to apply a metallic ink material having sufficient conductive properties to satisfy the design requirements for the PCB 300. Various types of conductive ink can be selected including, without limitation, metallic materials, carbon based materials, graphite-based materials, etc. According to other embodiments, however, conventional fabrication techniques can also be utilized to form the circuit patterns 314a and ground plane 320. More particularly, the circuit patterns 314a can be formed by depositing a metallic (or conductive) layer onto the plastic base 312a, and aligning a photomask containing the circuit design for the circuit patterns 314a. The circuit design can then be transferred onto the metallic/conductive layer. Next, one or more etching processes (wet and/or dry) can be performed to remove any excess portions of the metallic layer, thereby retaining the circuit patterns 314a on the plastic base 312a. If multiple circuit layers must be fabricated to achieve the circuit patterns 314a or the ground plane 320, then the process can be repeated for each subsequent layer.

As illustrated in FIG. 3, the second antenna patch 310b is formed (or arranged) on the first antenna patch 310a. The second antenna patch 310b can include a plastic base 312b disposed directly on the circuit patterns 314a of the first antenna patch 310a. The second antenna patch 310b also includes circuit patterns 314b formed directly on a top surface of the plastic base 312b. As illustrated in FIG. 3, the antenna patches 310 can be repeatedly stacked on each other until the $i^{th}$ (or final) antenna patch 310i is reached. According to various embodiments, some or all of the antenna patches 310a-310i can be identically configured. For example, the second antenna patch 310b through the $i^{th}$ antenna patch 310i can each include circuit patterns 314 (i.e., 314a, 314b, . . . 314i) formed by a printing process which utilizes conductive ink, or using conventional fabrication processes. The thickness of the plastic bases 312 (i.e., 312a, 312b, . . . 312i) can also be identical. According to other embodiments, however, the thickness of the plastic bases 312 may be different from each other, and some of the circuit patterns 314 can printed using conductive ink while others are formed using various fabrication processes.

The PCB 300 includes a separator 322 aligned with, and disposed on, the circuit patterns 314i of the i$^{th}$ antenna patch 310i. The separator 322 can be constructed from various materials including foam, plastic, etc. The PCB 300 also includes multiple polarizers 340a-340k and polarizer spacers 330a-330j. Depending on the specific implementation or design requirements, the polarizers 340 can be in the form of meanderline polarizers. Other types of polarizers can also be used as part of the PCB 300. The first polarizer 340a is aligned with, and disposed on, the separator 322. According to the embodiment illustrated in FIG. 3, the first polarizer 340a includes a plastic base 342a that is aligned with and disposed on the first polarizer spacer 330a. The plastic base 342a can have a thickness ranging from 0.09 mm-0.15 mm, depending on the specific design requirements. Furthermore, the plastic base 342a can be constructed from various materials such as PET, polystyrene, polypropylene, various copolymers, etc. The first polarizer 340a also includes circuit patterns 344a that are formed directly on the plastic base 342a. The circuit patterns 344a of the first polarizer 340a can be formed by means of a 3D printer capable of operating with conductive ink and/or conventional PCB fabrication techniques. The first polarizer spacer 330a is aligned with, and disposed on, the circuit patterns 344a of the first polarizer 340a. The first polarizer spacer 330a can be constructed, for example, from a material such as foam and have a thickness ranging from 0.5 mm-0.9 mm, depending on the specific design requirements. According to various embodiments, the first polarizer spacer 330a can be constructed from a plastic material having high dielectric constant, and have a thickness of $\lambda/4$, corresponding to the wavelength of signals that will be directed toward the polarizer 340.

As illustrated in FIG. 3, the polarizers 340 and polarizer spacers 330 are alternately stacked on each other. The first polarizer spacer 330a, for example, is disposed on the first polarizer 340a. The second polarizer 340b is disposed on the first polarizer spacer 330a, and the second polarizer spacer 330b is disposed on the second polarizer 340b. This arrangement is repeated until the j$^{th}$ and k$^{th}$ (or last) polarizer spacer 330j and polarizer 340k are respectively reached. According to at least one embodiment, the polarizer spacers 330 can be identically configured. For example, the second polarizer spacer 330b—the j$^{th}$ polarizer spacer 330j can be constructed from the same material as the first polarizer spacer 330a, and have the same thickness as the first polarizer spacer 330a. According to other embodiments, however, the material and thickness of each polarizer spacer (330a-330j) can be independently selected.

The PCB 300 illustrated in FIG. 3 can also include one or more PCB circuit assemblies 380. If a single PCB circuit assembly 380 is provided, it is directly connected to the ground plane 320. If multiple PCB circuit assemblies 380a-380n are provide, however, only the final PCB circuit assembly 380n is directly connected to the ground plane. Each PCB circuit assembly 380 can further include multiple layers containing control circuitry, DC power distribution, RF power distribution, etc. According to various embodiments, each the PCB circuit assembly 380 can include a first PCB layer 382 and a second PCB layer 384 (i.e., 382a and 384a of PCB layer 380a, and 382n and 384n of PCB layer 380n). An insulating layer 388 is interposed between the first PCB layer 382 and the second PCB layer 384 (i.e., 388a between 382a and 384a of PCB layer 380a, and 388n between 382n and 384n of PCB layer 380n). According to at least one implementation, the insulating layer 388 can be constructed from a dielectric material. Additional PCB layers can also be provided depending on the specific design requirements. As illustrated in FIG. 3, vias or through holes 370 can be formed within the PCB circuit assembly 380 to interconnect different PCB layers (382, 384), interconnect the different PCB circuit assemblies 380, interconnect the different PCB circuit assemblies 380 to the antenna patches 310, ground plane, or any combination of the foregoing interconnections.

According to the illustrated embodiment, a foam cap 350 can be disposed on the circuit patterns 344k of the k$^{th}$ polarizer 340k. According to an exemplary system implementation, the foam cap 350 can have a thickness ranging from 4 mm-8 mm. Depending on the particular application, the foam cap 350 may also incorporate a predetermined amount of curvature. If the PCB 300 will be subject to environmental conditions such as rain, the curvature can assist in directing water off its surface. The PCB 300 further includes a seal 360 which surrounds (or wraps around) the ground plane 320, the PCB circuit assemblies 380, the separator 322, the antenna patches 310, the polarizer spacers 330, the polarizers 340, and the foam cap 350. A vacuum can subsequently be applied in order to form a monolithic component. According to an embodiment, the seal 360 can be in the form of a hydrophobic film (e.g., Teflon, SilverStone, etc.) having a thickness ranging from 0.09 mm-0.15 mm.

Figure 4:
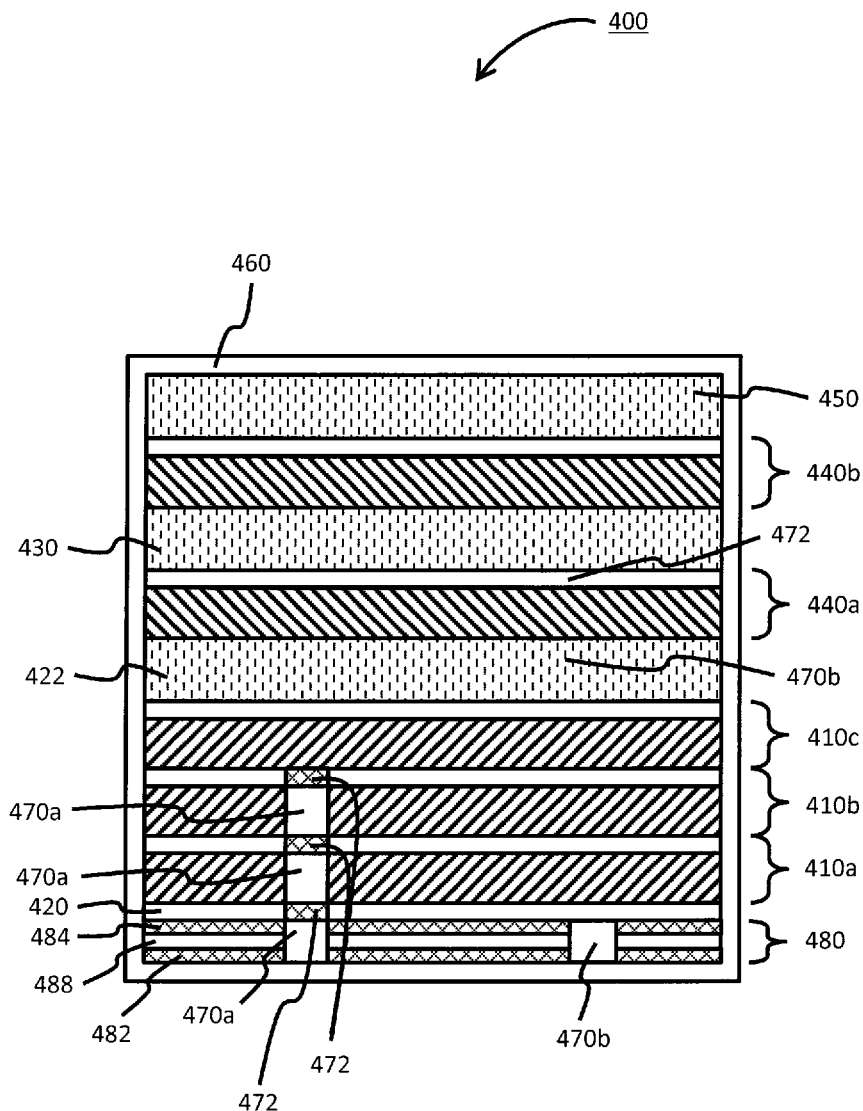
FIG. 4 is a diagram of a PCB incorporating a low loss, low cost material, according to at least one embodiment.

FIG. 4 illustrates a PCB 400 in accordance with various embodiments. The PCB 400 includes three antenna patches 410a, 410b, 410c, a ground plane 420, and two polarizers 440a, 440b. The second antenna patch 410b and the third antenna patch 410c are stacked on the first antenna patch 410a. The ground plane 420 can be in the form of one or more coupling circuit patterns 480 formed on a bottom surface of the first antenna patch 410a. The PCB 400 also includes a separator 422 disposed on the third antenna patch 410c, and a first polarizer 440a disposed on the separator 422. A polarizer spacer 430 is positioned on the first polarizer 440a, and a second polarizer 440b is positioned on the polarizer spacer 430. A foam cap 450 is subsequently positioned on the second polarizer 440b.

As previously discussed, each antenna patch 410 includes a plastic base and circuit patterns formed directly on the plastic base. Furthermore, each polarizer 440 includes a plastic base and circuit patterns formed directly on the plastic base. As illustrated in FIG. 4, the PCB 400 includes a PCB circuit assembly 480 connected to the ground plane 420. The PCB circuit assembly 480 includes a first PCB layer 482, a second PCB layer 484, and an insulating layer 488. The PCB circuit assembly 480 can be configured, for example, to incorporate control circuitry, DC power distribution, RF power distribution, etc. The PCB 400 further includes a seal 460 which surrounds the individual components of the PCB 400, thereby forming a monolithic unit. The antenna patches 410, ground plane 420, separator 422, polarizer spacer 430, polarizers 440, foam cap 450, PCB circuit assembly 480, and seal 460 can be sized and configured in the same manner previously described with respect to FIGS. 1 and 2.

According to the illustrated embodiment, the PCB 400 includes multiple connections between different layers. Such connections can be accomplished by forming vias 470 between the different layers. For example, the first antenna patch 410a and the second antenna patch 410b contain three vias 470a which interconnect the PCB circuit assembly 480, the ground plane 420, the first antenna patch 410a, and the second antenna patch 410b. The PCB circuit assembly 480 also includes a via 470b which interconnects the first PCB layer 482, the second PCB layer 484, and the ground plane 420.

According to an embodiment, the vias 470 can be formed by drilling holes through the different layers using an appropriate technique, such as a laser. The holes can be formed individually on each layer. Regardless of the methodology used to form the holes, they can be subsequently filled with conductive ink to form electrical connections. For example, a laser can be used to form the holes and a vacuum subsequently applied to draw the conductive ink through the holes. Depending on the specific implementation and design requirements, contact patches 472 can optionally be provided on the surface of the different layers where the respective circuit patterns are located. According to other embodiments, the vias 470 can be formed after the necessary layers have been stacked over each other. For example, the first vias 470a can be formed after the PCB circuit assembly 480, the ground plane 420, the first antenna patch 410a, and the second antenna patch 410b have been arranged. The second vias 470b can be formed after the third antenna patch 410c, the first polarizer 440a, and the second polarizer 440b have been arranged. Once the holes have been formed, conductive ink or other material can be used to fill them, thereby resulting in the conductive vias 470. For example, the holes can be filled with conductive material for low frequency applications, or filled with non-conductive material for high frequency applications. If conventional PCB fabrication techniques are used, for example, photolithography and etching can be applied to regions where the vias 470 should be formed.

Figure 5:
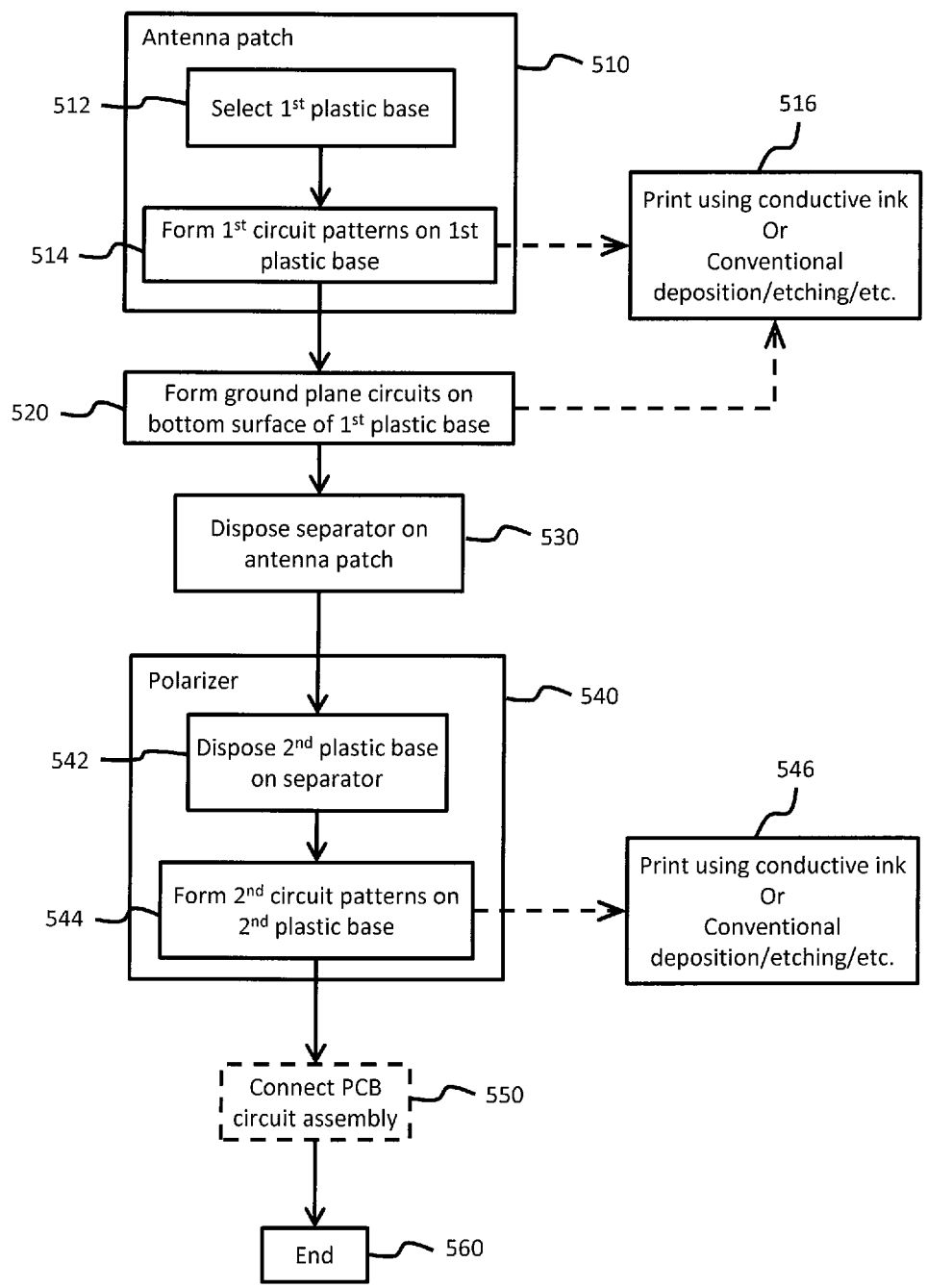
FIG. 5 is a process diagram for constructing a PCB with a low loss, low cost material, according to one embodiment.

FIG. 5 is a process diagram illustrating construction of a PCB in accordance with various embodiments. At 510, an antenna patch is formed. According to various embodiments, the antenna patch can be formed by selecting a first plastic base at 522. The size and material of first plastic base can be selected based on the particular design requirements. At 514, first circuit patterns are formed directly on a top surface of the first plastic base in order to complete the antenna patch. As illustrated in FIG. 5, the first circuit patterns can be formed using either 3D printing techniques which utilize conductive ink or conventional PCB fabrication techniques (e.g., photolithography, deposition, etching, etc.). This is indicated at 516. At 520, a ground plane is formed. More particularly, the ground plane is formed by forming one or more coupling circuits directly on a bottom surface of the first plastic base used for the antenna patch. Similar to the first circuit patterns, the coupling circuit patterns of the ground plane can be formed, at 516, by printing using conductive ink or conventional PCB fabrication techniques (photolithography, deposition, etching, etc.).

At 530, a separator is aligned with, and disposed on, the antenna patch. More particularly, the separator is disposed directly on the first circuit patterns. At 540, a polarizer is formed on the separator. According to the illustrated embodiment, the polarizer can be formed by disposing a second plastic base on top of the separator at 542. Second circuit patterns are then formed directly on the second plastic base at 544. Similar to the antenna patch and ground plane, the second circuit patterns can be printed using conductive ink (e.g., copper, silver, etc.) or fabricated using conventional PCB fabrication techniques. This is indicated at 546. According to one or more embodiments, a PCB circuit assembly can optionally be connected to the ground plane at 550 (i.e., the coupling circuits). The process ends at 560.

Figure 6:
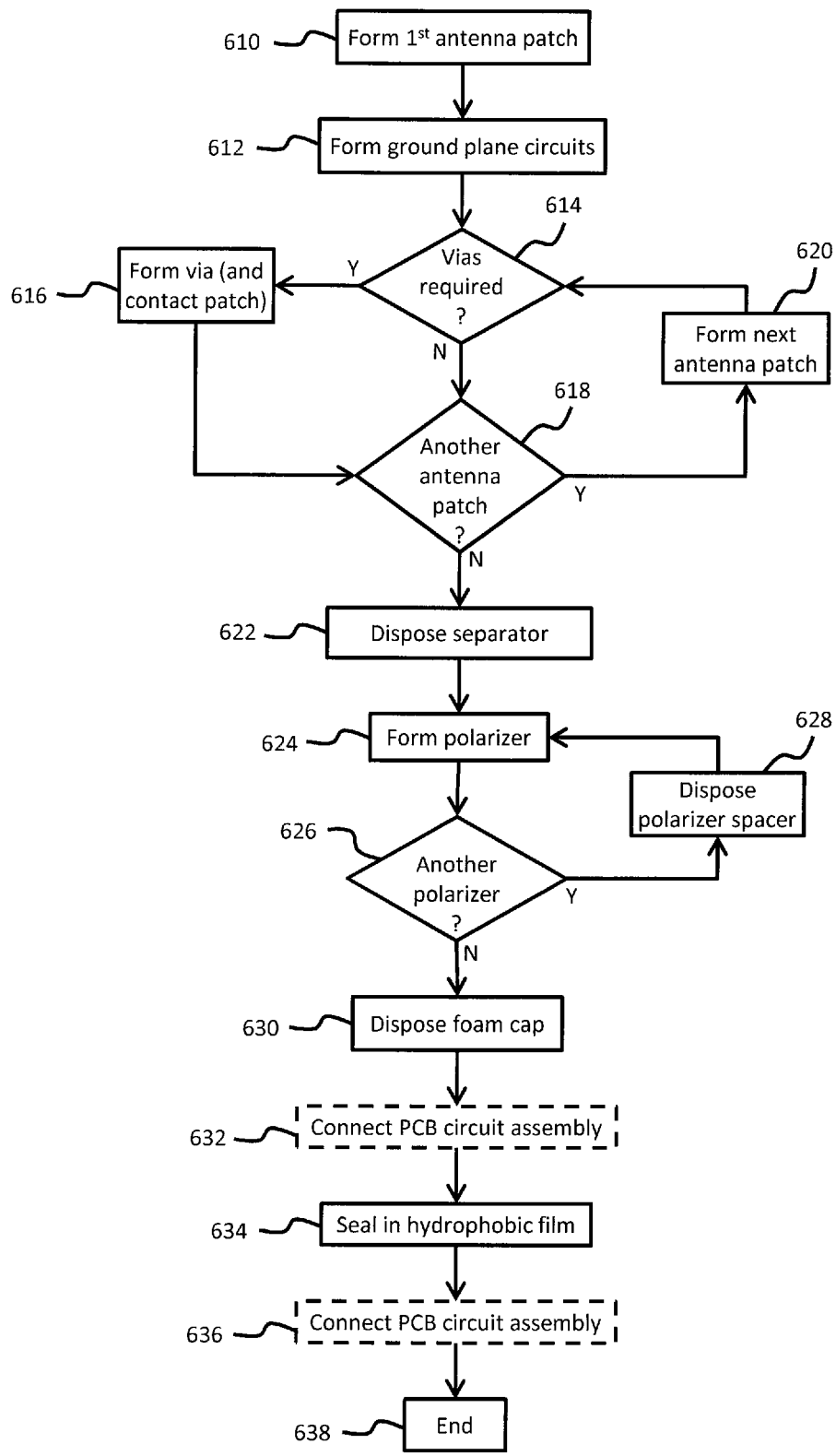
FIG. 6 is a flowchart of a process for constructing a PCB in accordance with various embodiments.

FIG. 6 is a flowchart illustrating the steps performed in constructing a PCB in accordance with various embodiments. At 610, a first antenna patch is formed. According to an embodiment, the first antenna patch can include a first plastic base, and first circuit patterns formed directly on the first plastic base. The first circuit patterns can be formed, for example, using a 3D printer and conductive ink, or conventional fabrication techniques. At 612, a ground plane is formed. As previously discussed, the ground plane can include coupling circuit patterns formed directly on a bottom surface of the first plastic base used of the first antenna patch. At 614, it is determined whether any vias (or openings) should be formed within the first antenna patch. If vias are desired, they are formed through the first antenna patch at 616. According to an embodiment, the vias can be formed by using a laser to drill holes through the required layers. Once the holes have been formed, conductive ink can be used to fill them, thereby resulting in vias having the required conductive properties. Depending on the specific configuration, contact patches can optionally be formed as connection points for the vias. Control then passes to 618.

If vias are not desired within the first antenna patch, control passes to 618 where it is determined whether another antenna patch is required. This can correspond, for example, to embodiments wherein multiple antenna patches are stacked upon each other. If an additional antenna patch is required, then control passes to 620 where the next antenna patch is formed. Control then returns to 614 in order to determine whether vias should be formed on the next antenna patch. If no additional antenna patches are desired, or the requisite number of antenna patches has been reached, control passes to 622. A separator is disposed on top of the antenna patch at 622. If multiple antenna patches were formed, then the polarizer spacer would only be provided on the final antenna patch. At 624, a polarizer is formed on the polarizer spacer. According to various embodiments, the polarizer can include a second plastic base with second circuit patterns formed thereon. Furthermore, as previously discussed, the second circuit patterns can be printed using conductive ink, or formed using conventional fabrication techniques.

At 626, it is determined if another polarizer is required. If an additional polarizer is required, control passes to 628, where a polarizer spacer is disposed on the polarizer. At 624, the additional polarizer is stacked onto the polarizer spacer. If no additional polarizers are required, or the required number of polarizers has been reached, control passes to 630. A foam cap is disposed on the final polarizer. Depending on the specific application or design requirements, a PCB circuit assembly can be optionally connected to the ground plane at 632. At 634, a seal is used to wrap around the entire assembly thereby forming a monolithic unit. A vacuum can further be applied to evacuate any gas or moisture from the assembly. According to various embodiments, the seal can be in the form of a hydrophobic film such as Teflon, SilverStone, etc. As previously discussed, certain applications require formation of the PCB circuit assembly prior application of the hydrophobic seal. If the PCB circuit assembly is not incorporated within the hydrophobic seal, however, a PCB circuit assembly is optionally connected to the ground plane (i.e., the coupling circuits) at 636. According to such embodiments, physical connections can be created by drilling through the seal and utilizing cables either alone or in combination with connectors to establish connectivity between the ground plane and the PCB circuit assembly. The process ends at 638.

Various features described herein may be implemented via software, hardware (e.g., general processor, Digital Signal Processing (DSP) chip, an Application Specific Integrated Circuit (ASIC), Field Programmable Gate Arrays (FPGAs), etc.), firmware or a combination thereof. Furthermore, various features can be implemented using algorithms illustrated in the form of flowcharts and accompanying descriptions. Some or all steps associated with such flowcharts can be performed in a sequence independent manner, unless otherwise indicated. Those skilled in the art will also understand that features described in connection with one Figure can be combined with features described in connection with another Figure. Such descriptions are only omitted for purposes of avoiding repetitive description of every possible combination of features that can result from the disclosure.

The terms software, computer software, computer program, program code, and application program may be used interchangeably and are generally intended to include any sequence of machine or human recognizable instructions intended to program/configure a computer, processor, server, etc. to perform one or more functions. Such software can be rendered in any appropriate programming language or environment including, without limitation: C, C++, C#, Python, R, Fortran, COBOL, assembly language, markup languages (e.g., HTML, SGML, XML, VoXML), Java, JavaScript, etc. As used herein, the terms processor, microprocessor, digital processor, and CPU are meant generally to include all types of processing devices including, without limitation, single/multi-core microprocessors, digital signal processors (DSPs), reduced instruction set computers (RISC), general-purpose (CISC) processors, gate arrays (e.g., FPGAs), PLDs, reconfigurable compute fabrics (RCFs), array processors, secure microprocessors, and application-specific integrated circuits (ASICs). Such digital processors may be contained on a single unitary IC die, or distributed across multiple components. Such exemplary hardware for implementing the described features are detailed below.

Figure 7:
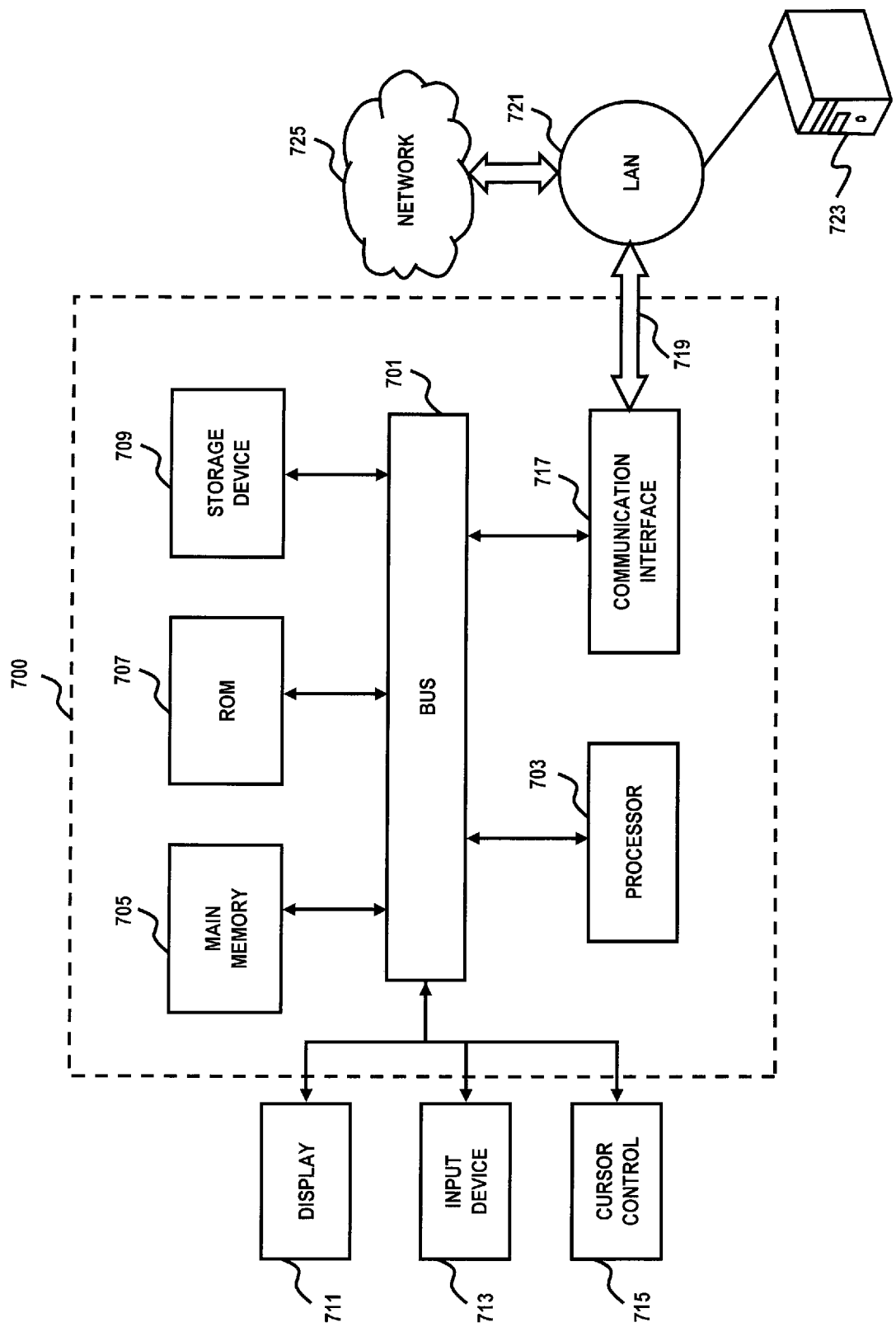
FIG. 7 is a diagram of a computer system that can be used to implement various exemplary features and embodiments.

FIG. 7 is a diagram of a computer system that can be used to implement features of various embodiments. The computer system 700 includes a bus 701 or other communication mechanism for communicating information and a processor 703 coupled to the bus 701 for processing information. The computer system 700 also includes main memory 705, such as a random access memory (RAM), dynamic random access memory (DRAM), synchronous dynamic random access memory (SDRAM), double data rate synchronous dynamic random-access memory (DDR SDRAM), DDR2 SDRAM, DDR3 SDRAM, DDR4 SDRAM, etc., or other dynamic storage device (e.g., flash RAM), coupled to the bus 701 for storing information and instructions to be executed by the processor 703. Main memory 705 can also be used for storing temporary variables or other intermediate information during execution of instructions by the processor 703. The computer system 700 may further include a read only memory (ROM) 707 or other static storage device coupled to the bus 701 for storing static information and instructions for the processor 703. A storage device 709, such as a magnetic disk or optical disk, is coupled to the bus 701 for persistently storing information and instructions.

The computer system 700 may be coupled via the bus 701 to a display 711, such as a light emitting diode (LED) or other flat panel displays, for displaying information to a computer user. An input device 713, such as a keyboard including alphanumeric and other keys, is coupled to the bus 701 for communicating information and command selections to the processor 703. Another type of user input device is a cursor control 715, such as a mouse, a trackball, or cursor direction keys, for communicating direction information and command selections to the processor 703 and for controlling cursor movement on the display 711. Additionally, the display 711 can be touch enabled (i.e., capacitive or resistive) in order facilitate user input via touch or gestures.

According to an exemplary embodiment, the processes described herein are performed by the computer system 700, in response to the processor 703 executing an arrangement of instructions contained in main memory 705. Such instructions can be read into main memory 705 from another computer-readable medium, such as the storage device 709. Execution of the arrangement of instructions contained in main memory 705 causes the processor 703 to perform the process steps described herein. One or more processors in a multi-processing arrangement may also be employed to execute the instructions contained in main memory 705. In alternative embodiments, hard-wired circuitry may be used in place of or in combination with software instructions to implement exemplary embodiments. Thus, exemplary embodiments are not limited to any specific combination of hardware circuitry and software.

The computer system 700 also includes a communication interface 717 coupled to bus 701. The communication interface 717 provides a two-way data communication coupling to a network link 719 connected to a local network 721. For example, the communication interface 717 may be a digital subscriber line (DSL) card or modem, an integrated services digital network (ISDN) card, a cable modem, fiber optic service (FiOS) line, or any other communication interface to provide a data communication connection to a corresponding type of communication line. As another example, communication interface 717 may be a local area network (LAN) card (e.g. for Ethernet™ or an Asynchronous Transfer Mode (ATM) network) to provide a data communication connection to a compatible LAN. Wireless links can also be implemented. In any such implementation, communication interface 717 sends and receives electrical, electromagnetic, or optical signals that carry digital data streams representing various types of information. Further, the communication interface 717 can include peripheral interface devices, such as a Universal Serial Bus (USB) interface, a High Definition Multimedia Interface (HDMI), etc. Although a single communication interface 717 is depicted in FIG. 7, multiple communication interfaces can also be employed.

The network link 719 typically provides data communication through one or more networks to other data devices. For example, the network link 719 may provide a connection through local network 721 to a host computer 723, which has connectivity to a network 725 such as a wide area network (WAN) or the Internet. The local network 721 and the network 725 both use electrical, electromagnetic, or optical signals to convey information and instructions. The signals through the various networks and the signals on the network link 719 and through the communication interface 717, which communicate digital data with the computer system 700, are exemplary forms of carrier waves bearing the information and instructions.

The computer system 700 can send messages and receive data, including program code, through the network(s), the network link 719, and the communication interface 717. In the Internet example, a server (not shown) might transmit requested code belonging to an application program for implementing an exemplary embodiment through the network 725, the local network 721 and the communication interface 717. The processor 703 may execute the transmitted code while being received and/or store the code in the storage device 709, or other non-volatile storage for later execution. In this manner, the computer system 700 may obtain application code in the form of a carrier wave.

The term "computer-readable medium" as used herein refers to any medium that participates in providing instructions to the processor 703 for execution. Such a medium may take many forms, including but not limited to non-volatile media, volatile media, and transmission media. Non-volatile media include, for example, optical or magnetic disks, such as the storage device 709. Non-volatile media can further include flash drives, USB drives, microSD cards, etc. Volatile media include dynamic memory, such as main memory 705. Transmission media include coaxial cables, copper wire and fiber optics, including the wires that comprise the bus 701. Transmission media can also take the form of acoustic, optical, or electromagnetic waves, such as those generated during radio frequency (RF) and infrared (IR) data communications. Common forms of computer-readable media include, for example, a USB drive, microSD card, hard disk drive, solid state drive, optical disk (e.g., DVD, DVD RW, Blu-ray), or any other medium from which a computer can read.

Figure 8:
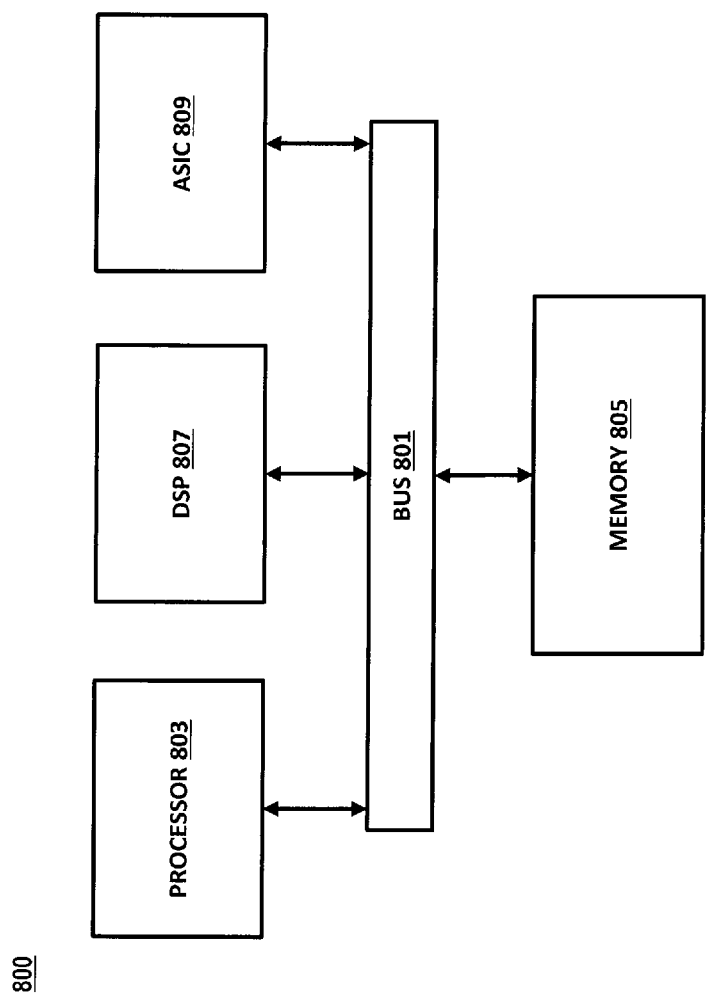
FIG. 8 is a diagram of a chip set that can be used to implement various exemplary features and embodiments.

FIG. 8 illustrates a chip set 800 upon which features of various embodiments may be implemented. Chip set 800 is programmed to implement various features as described herein and includes, for instance, the processor and memory components described with respect to FIG. 8 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in certain embodiments the chip set can be implemented in a single chip. Chip set 800, or a portion thereof, constitutes a means for performing one or more steps of the figures.

In one embodiment, the chip set 800 includes a communication mechanism such as a bus 801 for passing information among the components of the chip set 800. A processor 803 has connectivity to the bus 801 to execute instructions and process information stored in, for example, a memory 805. The processor 803 may include one or more processing cores with each core configured to perform independently. A multi-core processor enables multiprocessing within a single physical package. Examples of a multi-core processor include two, four, eight, or greater numbers of processing cores. Alternatively or in addition, the processor 803 may include one or more microprocessors configured in tandem via the bus 801 to enable independent execution of instructions, pipelining, and multithreading. The processor 803 may also be accompanied with one or more specialized components to perform certain processing functions and tasks such as one or more digital signal processors (DSP) 807, or one or more application-specific integrated circuits (ASIC) 809. A DSP 807 typically is configured to process real-world signals (e.g., sound) in real time independently of the processor 803. Similarly, an ASIC 809 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 803 and accompanying components have connectivity to the memory 805 via the bus 801. The memory 805 includes both dynamic memory (e.g., RAM, magnetic disk, re-writable optical disk, etc.) and static memory (e.g., ROM, CD-ROM, DVD, BLU-RAY disk, etc.) for storing executable instructions that when executed perform the inventive steps described herein. The memory 805 also stores the data associated with or generated by the execution of the inventive steps.

While certain exemplary embodiments and implementations have been described herein, other embodiments and modifications will be apparent from this description. Accordingly, the various embodiments described are not intended to be limiting, but rather are encompassed by the broader scope of the presented claims and various obvious modifications and equivalent arrangements.

What is claimed is:

1. A method comprising:
   forming an antenna patch by forming a first plurality of circuit patterns directly on a top surface of a first plastic base;
   forming a ground plane directly on a bottom surface of the first plastic base with a coupling circuit pattern formed directly on a bottom surface of the ground plane;
   disposing a separator directly on the first plurality of circuit patterns; and
   forming a polarizer directly on the separator by disposing a second plastic base on the separator, and forming a second plurality of circuit patterns directly on a top surface of the second plastic base.

2. The method of claim 1, further comprising forming at least one additional antenna patch on the antenna patch.

3. The method of claim 1, further comprising:
   disposing a foam cap on the polarizer; and
   sealing the antenna patch, ground plane, separator, and polarizer within a hydrophobic film.

4. The method of claim 1, further comprising:
   forming at least one additional polarizer on the polarizer; and
   aligning a polarizer spacer between the polarizer and one of the at least one additional polarizer, or between two of the at least one additional polarizer.

5. The method of claim 1, wherein forming the ground plane comprises printing the one or more coupling circuit patterns on the bottom surface of the first plastic base using a conductive ink.

6. The method of claim 1, wherein forming the ground plane comprises:
   depositing a metallic layer onto the bottom surface of the first plastic base;
   aligning a photomask containing the one or more circuit patterns with the first plastic base;
   transferring the one or more circuit patterns to the metallic layer; and
   etching the metallic layer to retain the one or more circuit patterns on the first plastic base.

7. The method of claim 1, wherein the first plastic base and the second plastic base comprise a polyethylene terephthalate (PET) material.

8. The method of claim 1, wherein the first plastic base and the second plastic base comprise a copolymer.

9. The method of claim 1, wherein the first plastic base and the second plastic base each comprise either a PET material or a copolymer.

10. The method of claim 1, further comprising forming one or more vias between the antenna patch, the spacer, and/or the polarizer.

11. The method of claim 10, wherein forming the one or more vias comprises:
   creating, for each of the one or more vias, a cavity extending between the antenna patch, the spacer, and/or the polarizer; and
   drawing the conductive ink into each of the cavities by generating a vacuum.

12. An antenna patch apparatus comprising:
   a first plurality of circuit patterns directly on a top surface of a first plastic base;
   a ground plane directly on a bottom surface of the first plastic base with a coupling circuit pattern directly on a bottom surface of the ground plane;
   a separator disposed directly on the first plurality of circuit patterns; and
   a polarizer disposed directly on the separator, wherein the polarizer includes a second plastic base disposed on the separator, and a second plurality of circuit patterns directly on a top surface of the second plastic base.

13. The apparatus of claim 12, further comprising at least one additional antenna disposed on the antenna patch.

14. The apparatus of claim 12, further comprising:
   a foam cap disposed on the polarizer; and
   a hydrophobic film for sealing the antenna patch, ground plane, separator, and polarizer.

15. The apparatus of claim 12, further comprising:
   at least one additional polarizer disposed on the polarizer; and
   a polarizer spacer aligned either between the polarizer and one of the at least one additional polarizer, between two of the at least one additional polarizer, or any combination thereof.

16. The apparatus of claim 12 wherein the first plurality of circuit patterns, the ground plane, and the second plurality of circuit patterns are formed by printing using a conductive ink.

17. The apparatus of claim 12 wherein the first plastic base and the second plastic base comprise a polyethylene terephthalate (PET) material.

18. The apparatus of claim 12 wherein the first plastic base and the second plastic base comprise a copolymer.

19. The apparatus of claim 12 wherein:
   the first plastic base comprises either a PET material or a copolymer; and
   the second plastic base comprises either a PET material or a copolymer.

20. The apparatus of claim 12, further comprising one or more vias interconnecting any combination of the antenna patch, the ground plane, and/or the polarizer.

* * * * *